US012666783B2

(12) United States Patent
Nakata et al.

(10) Patent No.: US 12,666,783 B2
(45) Date of Patent: Jun. 23, 2026

(54) LIGHT-EMITTING ELEMENT, LIGHT-EMITTING DEVICE, AND METHOD OF MANUFACTURING LIGHT- EMITTING ELEMENT

(71) Applicant: SHARP KABUSHIKI KAISHA, Sakai City (JP)

(72) Inventors: Kanako Nakata, Sakai City (JP); Tatsuya Ryohwa, Sakai City (JP); Makoto Izumi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 1386 days.

(21) Appl. No.: 17/421,370

(22) PCT Filed: Jan. 15, 2019

(86) PCT No.: PCT/JP2019/000967
§ 371 (c)(1),
(2) Date: Jul. 7, 2021

(87) PCT Pub. No.: WO2020/148812
PCT Pub. Date: Jul. 23, 2020

(65) Prior Publication Data

US 2022/0059766 A1 Feb. 24, 2022

(51) Int. Cl.

| | |
|---|---|
| ***H01L 51/00*** | (2006.01) |
| ***H10K 50/115*** | (2023.01) |
| ***H10K 85/10*** | (2023.01) |
| *B82Y 20/00* | (2011.01) |
| *B82Y 40/00* | (2011.01) |
| *H10K 71/40* | (2023.01) |
| *H10K 102/00* | (2023.01) |

(52) U.S. Cl.
CPC ......... *H10K 50/115* (2023.02); *H10K 85/141* (2023.02); *B82Y 20/00* (2013.01); *B82Y 40/00* (2013.01); *H10K 71/40* (2023.02); *H10K 2102/00* (2023.02)

(58) Field of Classification Search
None
See application file for complete search history.

(56) References Cited

U.S. PATENT DOCUMENTS

2006/0088713 A1* 4/2006 Dykstra .................... C09C 1/10 428/402
2008/0237611 A1* 10/2008 Cok ....................... H10K 50/86 257/79
2010/0108984 A1 5/2010 Cho et al.
2015/0291876 A1 10/2015 Koole et al.
(Continued)

FOREIGN PATENT DOCUMENTS

CN 104755585 A 7/2015
CN 107636112 A 1/2018
(Continued)

*Primary Examiner* — Jay Yang
(74) *Attorney, Agent, or Firm* — ScienBiziP, P.C.

(57) ABSTRACT

A light-emitting element includes: an anode; a cathode; and a light-emitting layer between the anode and the cathode, wherein the light-emitting layer contains quantum dots and ligands, the ligands are a polymer including at least two repeating units, and each repeating unit includes, at an end of at least one side chain thereof, a modified functional group coordinated to any one of the quantum dots.

13 Claims, 5 Drawing Sheets

(56) References Cited

U.S. PATENT DOCUMENTS

| | | | |
|---|---|---|---|
| 2015/0333102 | A1 | 11/2015 | Sato |
| 2017/0222097 | A1 | 8/2017 | Lub et al. |
| 2018/0079868 | A1 | 3/2018 | Yamada et al. |
| 2019/0207137 | A1 | 7/2019 | Mei |
| 2020/0028090 | A1 | 1/2020 | Zhang |

FOREIGN PATENT DOCUMENTS

| | | | |
|---|---|---|---|
| CN | 108129661 | A | 6/2018 |
| CN | 108242482 | A | 7/2018 |
| CN | 109180853 | A | 1/2019 |
| JP | 2010114079 | A | 5/2010 |
| JP | 2015220069 | A | 12/2015 |
| JP | 2017524156 | A | 8/2017 |
| JP | 2018137281 | A | 8/2018 |

* cited by examiner

LIGHT-EMITTING ELEMENT, LIGHT-EMITTING DEVICE, AND METHOD OF MANUFACTURING LIGHT- EMITTING ELEMENT

TECHNICAL FIELD

The disclosure relates to light-emitting elements containing quantum dots and also to light-emitting devices including such a light-emitting element.

BACKGROUND ART

Patent Literature 1 discloses a light-emitting device including a nanoparticulate fluorescent material containing quantum dots and surface modification portions covering the surface of the quantum dots. The quantum dots exhibit improved stability in a medium when ligands with functional groups for coordinate bonding with the quantum dots are coordinated around the quantum dots, as described in Patent Literature 1.

CITATION LIST

Patent Literature

Patent Literature 1
Japanese Unexamined Patent Application Publication Tokukai, No. 2018-137281

SUMMARY

Technical Problem

Although the known ligands described in Patent Literature 1 are capable of improving the stability of quantum dots in a medium, the stability of quantum dots may be degraded in the process of stacking quantum dots to form a film. The stacked quantum dots may thus aggregate and be degraded in the layer containing the stacked quantum dots.

Solution to Problem

To address these problems, the disclosure, in an aspect thereof, is directed to a light-emitting element including: an anode; a cathode; and a light-emitting layer between the anode and the cathode, wherein the light-emitting layer contains quantum dots and ligands, the ligands are a polymer including at least two repeating units, and each repeating unit includes, at an end of at least one side chain thereof, a modified functional group coordinated to any one of the quantum dots.

To address these problems, the disclosure, in another aspect thereof, is directed to a method of manufacturing a light-emitting element, the method including the polymerization step of simultaneously heating, and shining ultraviolet light on, a first solution containing quantum dots and first ligands, each first ligand including a polymerizable functional group including, at an end of at least one side chain of the polymerizable functional group, a first modified functional group coordinated to any one of the quantum dots, to form a light-emitting layer containing the quantum dots and the first ligands in which at least some of the polymerizable functional groups are polymerized with each other.

Advantageous Effects of Disclosure

The disclosure, in an aspect thereof, can improve the stability of quantum dots in a layer containing the quantum dots.

DESCRIPTION OF EMBODIMENTS

Embodiment 1

Figure 2:
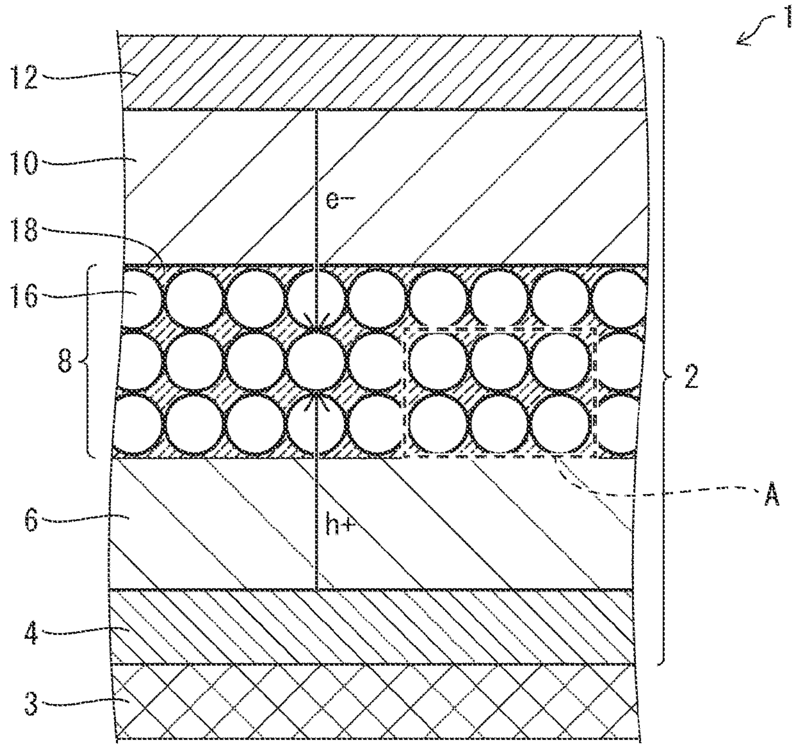
FIG. 2 is a schematic cross-sectional view of a light-emitting device in accordance with Embodiment 1 of the disclosure.

FIG. 2 is a schematic cross-sectional view of a light-emitting device 1 in accordance with the present embodiment.

Referring to FIG. 2, the light-emitting device 1 in accordance with the present embodiment includes a light-emitting element 2 and an array substrate 3. The light-emitting device 1 has a structure in which the layers that form the light-emitting element 2 are stacked on the array substrate 3 that carries TFTs (thin film transistors, not shown) thereon. The direction from the light-emitting element 2 to the array substrate 3 in the light-emitting device 1 will be referred to as the "downward direction" throughout the present specification. Meanwhile, the direction from the array substrate 3 for the light-emitting element 2 to the light-emitting element 2 will be referred to as the "upward direction" throughout the present specification.

The light-emitting element 2 includes a hole transport layer 6, a light-emitting layer 8, an electron transport layer 10, and a cathode 12 arranged in this order on an anode 4 when viewed from the underlying anode 4. The anode 4 of the light-emitting element 2, provided on the array substrate 3, is electrically connected to one of the TFTs on the array substrate 3. In an alternative embodiment, the light-emitting element may include a cathode on the array substrate and further include an electron transport layer, a light-emitting layer, a hole transport layer, and an anode arranged in this order on the cathode.

The anode 4 and the cathode 12 contain a conductive material and are electrically connected to the hole transport layer 6 and the electron transport layer 10 respectively.

Either the anode 4 or the cathode 12 is a transparent electrode. The transparent electrode may be formed of, for example, ITO, IZO, ZnO, AZO, or BZO by, for example, sputtering. Either the anode 4 or the cathode 12 may contain a metal material. The metal material is preferably Al, Cu, Au, Ag, or a like material that exhibits a high reflectance in the visible range.

The light-emitting layer 8 contains quantum dots (semiconductor nanoparticles) 16 and ligands 18 coordinated to the quantum dots 16 in the present embodiment. The light-emitting layer 8 may include a stack of light-emitting layers. The quantum dots 16 are not necessarily arranged regularly in the light-emitting layer 8 as shown in FIG. 2 and may be disordered in the light-emitting layer 8. The light-emitting layer 8 preferably has a thickness of 5 to 50 nm.

Figure 1:
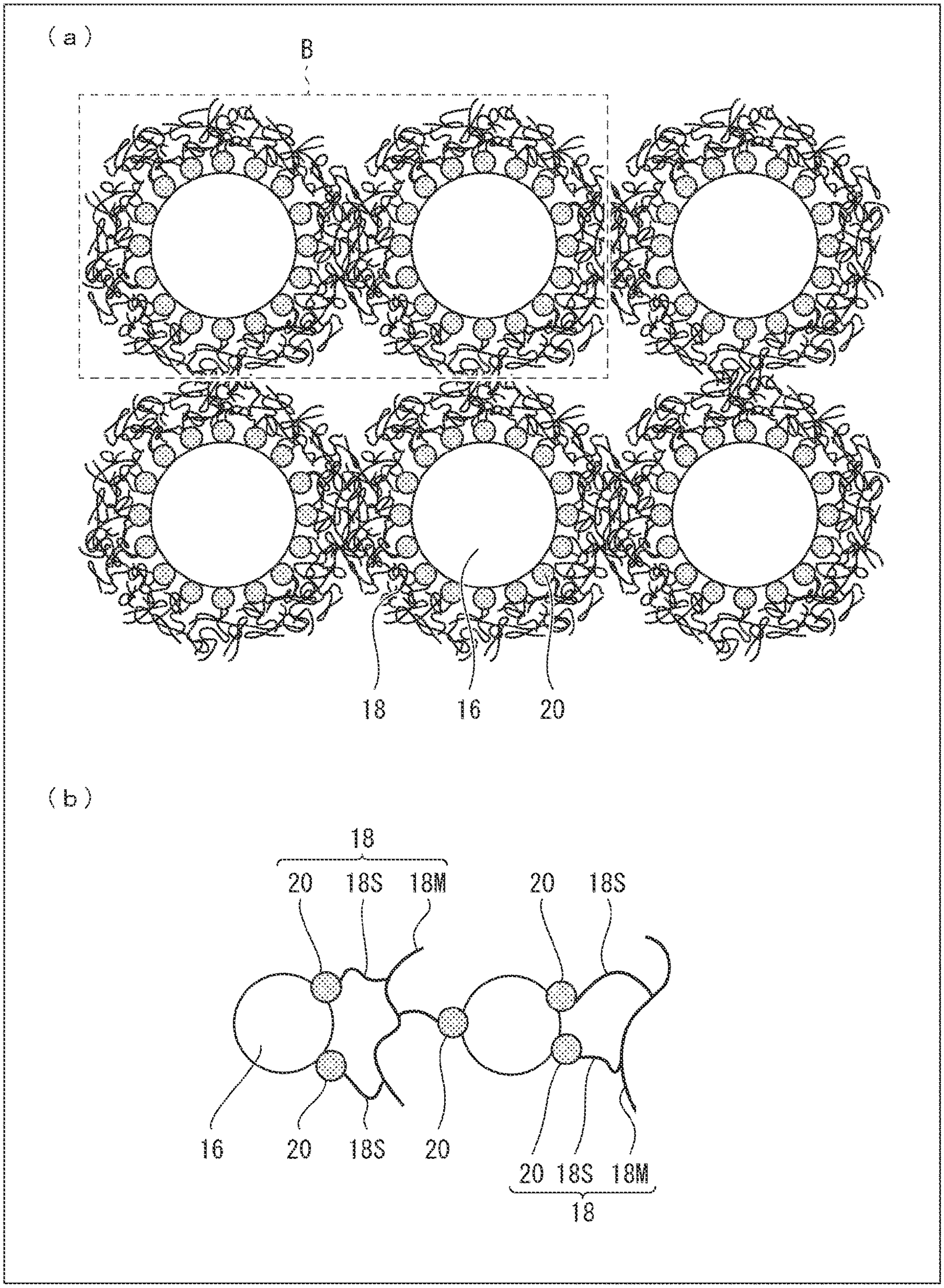
FIG. 1 is a set of schematic enlarged diagrams of quantum dots in accordance with Embodiment 1 of the disclosure and ligands coordinated to the quantum dots.

A description is now given of the quantum dots 16 and the ligands 18 in the light-emitting layer 8 with reference to FIG. 1. Portion (a) of FIG. 1 is an enlarged diagram of region A shown in FIG. 2, illustrating the quantum dots 16 and the ligands 18 in the light-emitting layer 8 in further detail. Portion (b) of FIG. 1 is an enlarged diagram of region B shown in (a) of FIG. 1, illustrating the quantum dots 16 and the ligands 18 in the light-emitting layer 8 in further detail. For convenience of description, (b) of FIG. 1 shows the structure of the ligand 18 in a simplified manner when compared with (a) of FIG. 1.

The quantum dots 16 have a valence band and a conduction band and emit light when the holes in the valence band and the electrons in the conduction band recombine. The quantum dots 16 are single fluorescent material particles that do not scatter light in the visible range. The emission from the quantum dots 16 has a narrow spectrum due to the quantum confinement effect and hence exhibits a relatively deep chromaticity.

The quantum dots 16 may contain any suitably chosen material used in the field of technology. The quantum dots 16 may contain, for example, one or more semiconductor materials selected from the group consisting of CdS, CdSe, CdTe, ZnS, ZnSe, ZnTe, InN, InP, InAs, InSb, AlP, AlS, AlAs, AlSb, GaN, GaP, GaAs, GaSb, PbS, PbSe, Si, Ge, MgS, MgSe, MgTe, and combinations thereof. The quantum dots 16 may have, for example, a core/shell structure including a core and a shell surrounding the core.

The quantum dots 16 have a particle diameter of approximately 3 to 15 nm. The wavelength of the emission from the quantum dots 16 is controllable through the particle diameter of the quantum dots 16. Therefore, the wavelength of the light emitted by the light-emitting device 1 can be controlled by controlling the particle diameter of the quantum dots 16.

In the present embodiment, the ligands 18 are a polymer including at least two repeating units. Each ligand 18 has at least one main chain 18M formed by polymerization of repeating units. The ligand 18 may have a single main chain 18M formed by polymerization of all repeating units. As another alternative, the ligand 18 may have two or more main chains 18M formed by polymerization of some of the repeating units.

Each repeating unit in the ligands 18 has at least one side chain 18S and also has a modified functional group 20 shown in (a) and (b) of FIG. 1 at the end of each side chain 18S. Polymerization of these repeating units provides a structure where there is provided a modified functional group 20 at the end of each side chain 18S extending from the main chain 18M as shown in (b) of FIG. 1.

Each modified functional group 20 is coordinated to one of the quantum dots 16. The modified functional groups 20 on the side chains 18S extending from the same main chain 18M may be coordinated to the same quantum dot 16 or different quantum dots 16 as shown in (b) of FIG. 1. The modified functional groups 20 on the side chains 18S extending from different main chains 18M may be coordinated to the same quantum dot 16 as shown in (b) of FIG. 1. The modified functional group 20 preferably includes at least one of a thiol group, a hydroxyl group, a carboxy group, and an amino group.

The repeating unit in the ligands 18 may include a functional group derived from a vinyl group, a vinylidene group, or a vinylene group. In other words, the repeating unit in the ligands 18 has, for example, the structure of formula (1) or (2).

[Chem. 1]

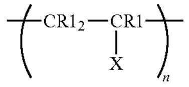

(1)

[Chem. 2]

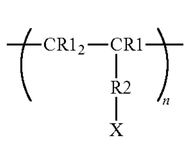

(2)

In the present embodiment, n is a natural number, and X is a modified functional group. Preferably, n is approximately 10,000. Again in the present embodiment, each R1 is independently selected from a hydrogen atom, an alkyl group, an aryl group, and an alkoxy group. R1's may be different from each other or the same with each other in a single repeating unit or in different repeating units. In the present embodiment, R2 may be a linking group including at least one of a substituted and an unsubstituted alkanediyl group and a substituted and an unsubstituted alkenediyl group. R2 may alternatively be a linking group including at least one of a carbonyl group (—CO—) and an imino group (—NH—). As another alternative, R2 may have at least one of a peptide bond (—CONH—), an ester bond (—COO—), and other like linking structures.

As a further alternative, the repeating unit in the ligands 18 may have the structure of formula (3).

[Chem. 3]

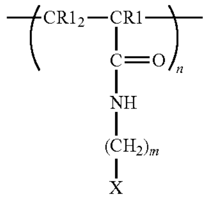

(3)

In the present embodiment, m is a natural number. The value of m affects the polarity of a precursor before the ligands 18 are polymerized that include repeating units having the structure of formula (3). When m is relatively small, for example, from 1 to 5, both inclusive, this precursor dissolves better in aqueous mediums. When m is relatively large, for example, greater than or equal to 5, the precursor dissolves better in organic mediums. From the viewpoint of maintaining the efficiency of electron injection to the quantum dots 16 to which the ligands 18 are coordinated, m is preferably less than or equal to 20.

As yet another alternative, the repeating unit in the ligands 18 may have the structure of formula (4).

[Chem. 4]

(4)

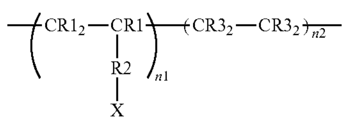

In the present embodiment, n1 and n2 are natural numbers. Preferably, n1 is from 1 to 3, both inclusive, and n2 is from 1 to 10, both inclusive, in the present embodiment. Again, in the present embodiment, each R3 is independently selected from a hydrogen atom, an alkyl group, an aryl group, an alkoxy group, and an amino group. R3's may be different from each other or the same with each other in a single repeating unit or in different repeating units. In the present embodiment, the number of modified functional groups 20 coordinated to one quantum dot 16 can be controlled through the presence of repeating units with no side chains in the ligands 18.

The hole transport layer 6 transports holes from the anode 4 to the light-emitting layer 8. The hole transport layer 6 may have a function of blocking electrons from moving from the light-emitting layer 8 to the anode 4 in the present embodiment. The electron transport layer 10 transports electrons from the cathode 12 to the light-emitting layer 8. The electron transport layer 10 may have a function of disrupting hole transport.

Each of the hole transport layer 6 and the electron transport layer 10 may contain a publicly known material used in the transport layer and may be formed by, for example, sputtering. Each of the hole transport layer 6 and the electron transport layer 10 may have a publicly known thickness of, for example, from 10 to 100 nm.

A description is given now of a method of manufacturing the light-emitting device 1 in accordance with the present embodiment.

The array substrate 3 is first prepared that includes TFTs and various wiring connected to the TFTs. The anode 4, electrically connected to the TFT, is then formed on the array substrate 3 by, for example, sputtering. The hole transport layer 6 is then formed on the anode 4 by, for example, coating.

Figure 3:
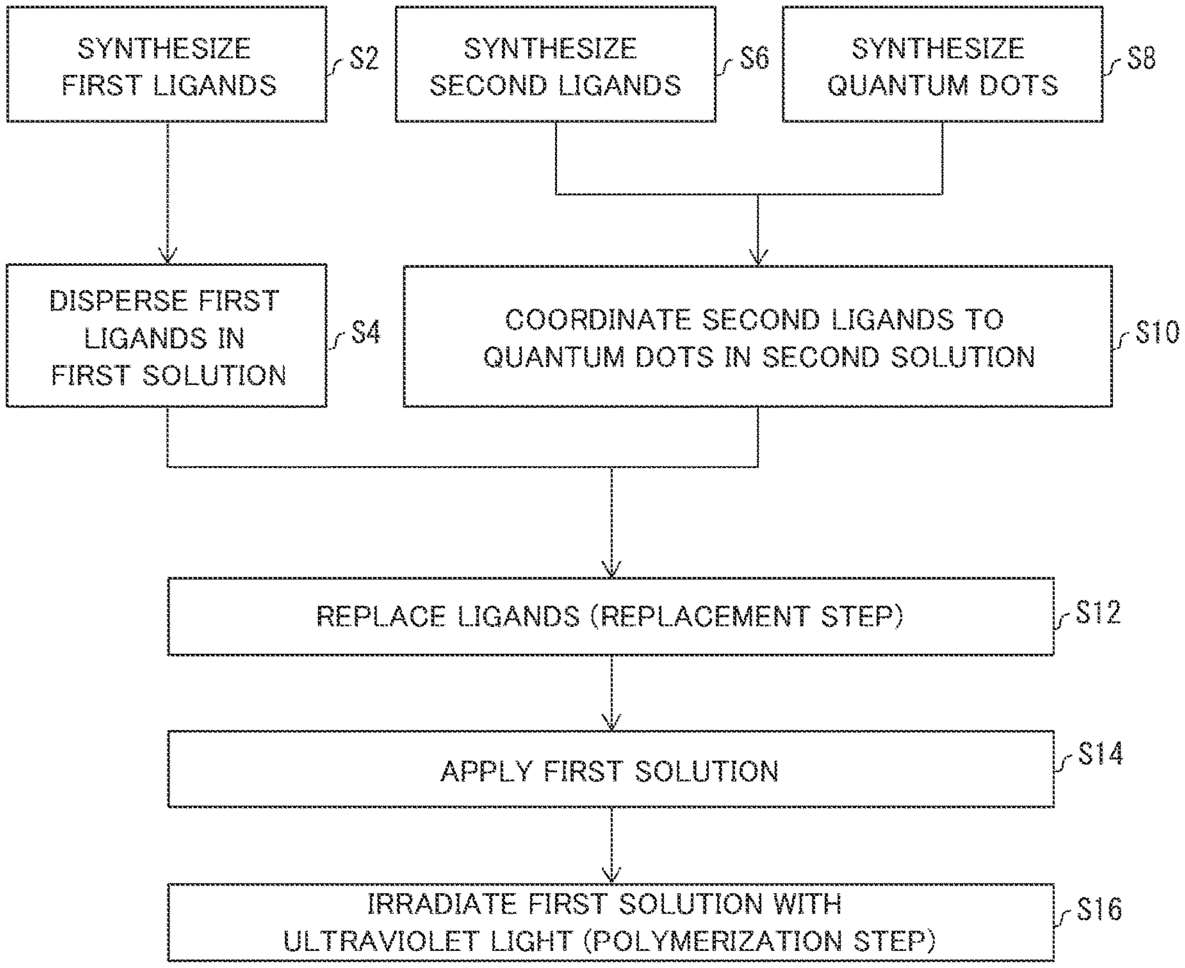
FIG. 3 is a flow chart representing a method of forming a light-emitting layer in accordance with Embodiment 1 of the disclosure.
Figure 4:
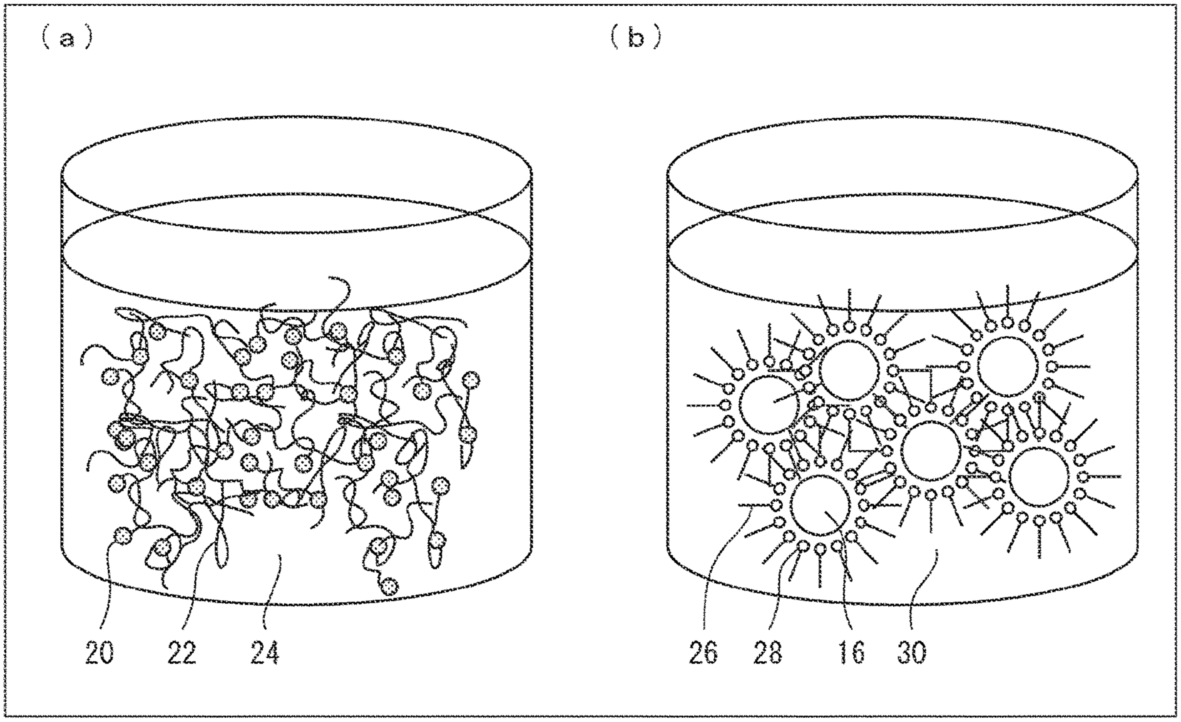
FIG. 4 is a set of schematic diagrams illustrating a first solution and a second solution prepared in the method of forming a light-emitting layer in accordance with Embodiment 1 of the disclosure.

The light-emitting layer 8 is then formed, which is now described in detail with reference to FIGS. 3 and 4. FIG. 3 is a flow chart representing a method of forming the light-emitting layer 8. FIG. 4 is a set of diagrams illustrating in detail the materials synthesized in a process of forming the light-emitting layer 8.

First, first ligands 22 shown in (a) of FIG. 4 are synthesized (step S2). Each first ligand 22, as shown in (a) of FIG. 4, includes a polymerizable functional group that has, at the end of at least one side chain thereof, the modified functional group 20 (first modified functional group).

The first ligand 22 has, for example, the structure of formula (5) or (6).

[Chem. 5]

(5)

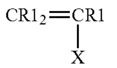

[Chem. 6]

-continued (6)

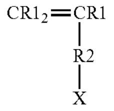

The first ligands 22 are then dispersed in a first solution 24 shown in (a) of FIG. 4 (step S4). The first solution 24 may be, for example, an aqueous medium or a non-aqueous medium.

Then, second ligands 26 shown in (b) of FIG. 4 are synthesized (step S6), separately from step S2 and step S4. Each second ligand 26 has a second modified functional group 28 at the end thereof. The second ligand 26 may include a publicly known modified functional group at an end of a linear alkyl such as alkyl amine. Alternatively, the second ligand 26 may be a publicly known ligand used in known quantum dots.

The quantum dots 16 are synthesized separately from step S6 (step S8). The quantum dots 16 may be synthesized by a publicly known synthesis method.

Subsequent to step S6 and step S8, the quantum dots 16 and the second modified functional groups 28 are coordinately bonded so that the second ligands 26 are coordinated to the quantum dots 16 (step S10). Step S10 is carried out by dispersing the quantum dots 16 and the second ligands 26 in a second solution 30 shown in (b) of FIG. 4. When the first solution 24 is an aqueous medium, the second solution 30 is preferably an organic medium. When the first solution 24 is a non-aqueous medium, the second solution 30 is preferably an aqueous medium.

Figure 5:
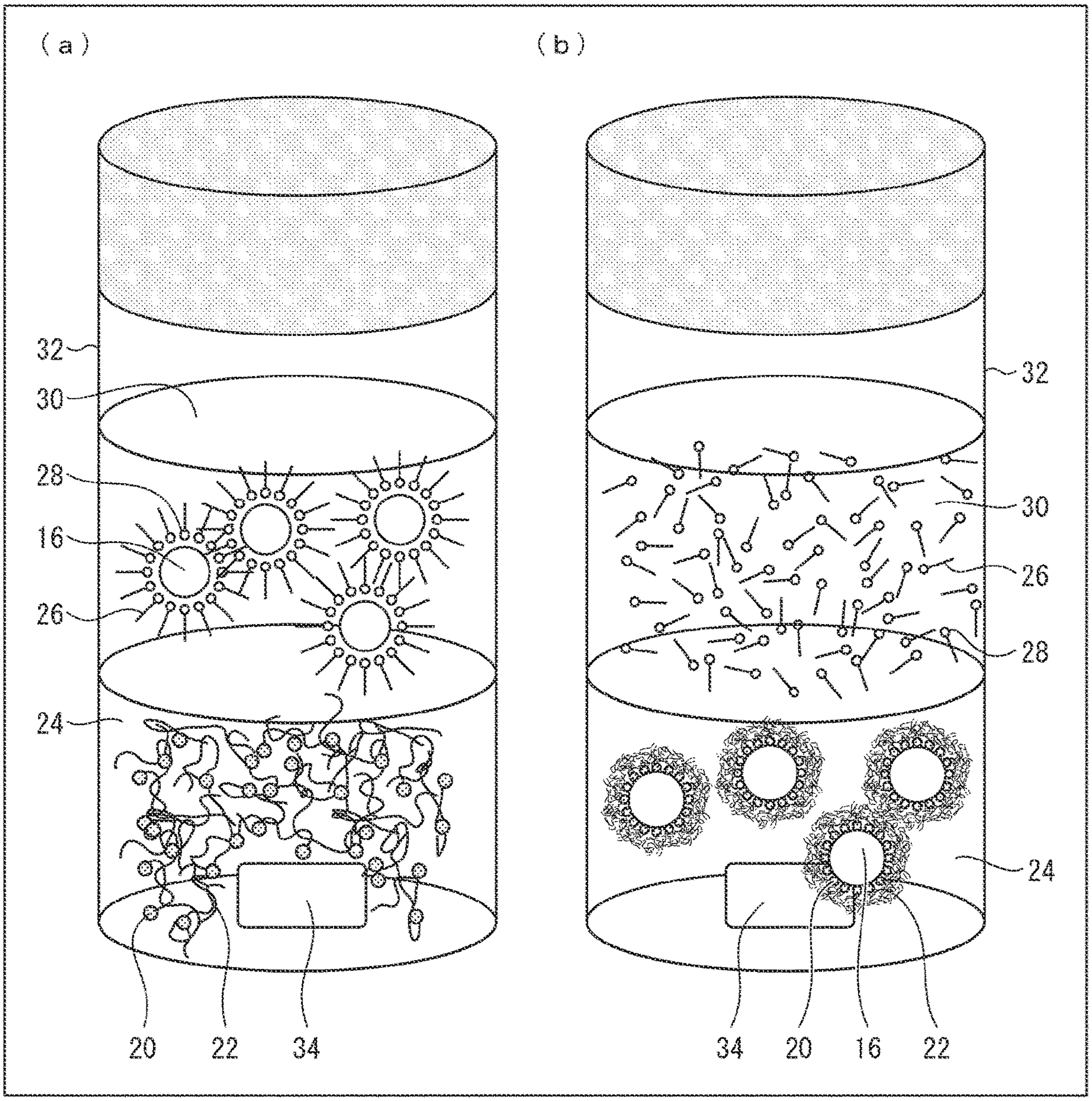
FIG. 5 is a set of manufacturing process diagrams illustrating a replacement step in accordance with Embodiment 1 of the disclosure.

Next, a replacement step (step S12) is carried out where the second ligands 26 coordinated to the quantum dots 16 are replaced by the first ligands 22, which is described in more detail below with reference to FIG. 5. FIG. 5 is a set of manufacturing process diagrams illustrating the replacement step.

The replacement step starts by injecting the first solution 24 and the second solution 30 into a stirring container 32 as shown in (a) of FIG. 5. It is preferred here to inject, into the stirring container 32, the first solution 24 containing more first ligands 22 than will actually be coordinated to the quantum dots 16 in the replacement step. As an example of the first solution 24, 1 mL of water containing the first ligands 22 in 300 mg/mL is injected into the stirring container 32. As an example of the second solution 30, 100 μL of hexane containing the quantum dots 16 and 24 mg/mL of alkyl amine, which is the second ligands 26, is injected into the stirring container 32. A stirring bar 34 is preferably installed in the stirring container 32 here.

The stirring container 32 is then tightly sealed, and the first solution 24 and the second solution 30 are stirred overnight. Since the first solution 24 contains an excess amount of the first ligands 22, the second ligands 26 coordinated to the quantum dots 16 are gradually replaced by the first ligands 22 in the stirring process. Thus, the first solution 24 is obtained that contains the quantum dots 16 and the first ligands 22 coordinated to the quantum dots 16 as shown in (b) of FIG. 5. The second ligands 26 remain in the second solution 30.

Only the first solution 24 can be extracted from the stirring container 32 by using, for example, a micropipette. The first solution 24 and the second solution 30 separate in the stirring container 32 as shown in FIG. 5 since the first solution 24 and the second solution 30 contain different types of mediums as described above. This separation facilitates the extraction of the first solution 24 alone that contains the quantum dots 16 and the first ligands 22 coordinated to the quantum dots 16.

The extracted first solution 24 may be placed in a centrifugation tube for centrifuge. The centrifuge may be carried out, for example, for 10 minutes at a rotation of 4,000 rpm. The process can remove those quantum dots 16 that are not dispersed in the first solution 24. The quantum dots 16 and the first ligands 22 here preferably have a mass ratio of from 10:90 to 1:99 in the first solution 24.

Next, the first solution 24 extracted by the technique described above is applied onto the completely formed hole transport layer 6 (step S14). A polymerization step (step S16) is then carried out where the applied first solution 24 is irradiated with ultraviolet light with a wavelength of 365 nm while being heated, for example, at approximately 100° C., to polymerize the polymerizable functional groups in the first solution 24. This step can both remove the medium from the first solution 24 and polymerize the polymerizable functional groups in the first ligands 22. Step S16 forms the light-emitting layer 8 that contains the quantum dots 16 to which the abovementioned ligands 18 are coordinated, which completes the process of forming the light-emitting layer 8 in accordance with the present embodiment.

The first ligand 22 may contain, for example, acrylamide of formula (7) in the process of forming the light-emitting layer in accordance with the present embodiment.

[Chem. 7]

(7)

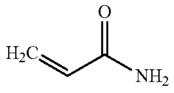

When the first ligand 22 contains acrylamide as a polymerizable functional group, the polymerization step provides the light-emitting layer 8 including the ligands 18 including the structure of formula (8) below as repeating units.

[Chem. 8]

(8)

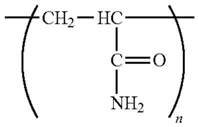

Alternatively or additionally, the first ligand 22 may contain, for example, 6-acrylamide hexanoic acid of formula (9) below in the process of forming the light-emitting layer in accordance with the present embodiment.

[Chem. 9]

(9)

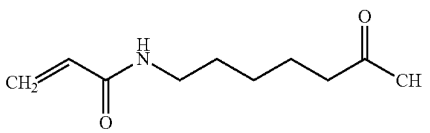

When the first ligand 22 contains 6-acrylamide hexanoic acid as a polymerizable functional group, the polymerization step provides the light-emitting layer 8 including the ligands 18 including the structure of formula (10) below as repeating units.

[Chem. 10]

(10)

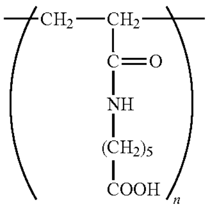

In other words, in the present embodiment, the first ligand 22 may contain an acroyl group such as acrylamide or 6-acrylamide hexanoic acid described above.

The first ligand 22 may contain, for example, a methacroyl group such as 2-aminoethyl methacrylamide of formula (11) below in the process of forming the light-emitting layer in accordance with the present embodiment.

[Chem. 11]

(11)

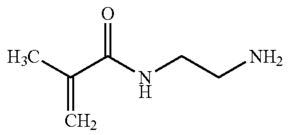

When the first ligand 22 contains 2-aminoethyl methacrylamide as a polymerizable functional group, the polymerization step provides the light-emitting layer 8 including the ligands 18 including the structure of formula (12) below as repeating units.

[Chem. 12]

(12)

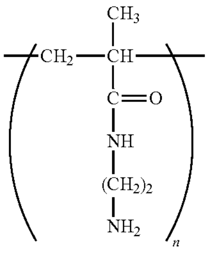

The first solution 24 may contain, for example, an unsubstituted or substituted alkene of formula (13) below in the process of forming the light-emitting layer in accordance with the present embodiment.

[Chem. 13]

$$CR3_2{=}CR3_2 \quad (13)$$

The unsubstituted or substituted alkene may be, for example, copolymerized with the first ligands 22 including the polymerizable functional groups of formula (6) above in the polymerization step. In such cases, the polymerization step provides the quantum dots 16 to which the ligands 18 are coordinated that include the structure of formula (4) above as repeating units.

It is only required in the polymerization step in accordance with the present embodiment to polymerize the polymerizable functional groups in at least some of the first ligands 22 in the first solution 24. Not the polymerizable functional groups in all the first ligands 22 need to be polymerized. In other words, some of the polymerizable functional groups may be left unpolymerized in the light-emitting layer 8 in accordance with the present embodiment. The light-emitting layer 8 may include the ligands 18 including polymerizable functional groups.

Finally, the electron transport layer 10 is formed on the light-emitting layer 8 by coating, and the cathode 12 is formed on the electron transport layer 10 by sputtering, to obtain the light-emitting element 2 shown in FIG. 2. That completes the manufacture of the light-emitting device 1 in accordance with the present embodiment.

The method of manufacturing the light-emitting layer 8 in accordance with the present embodiment includes a step of newly synthesizing the quantum dots 16, the first ligands 22, and the second ligands 26. This is by no means intended to limit the scope of the invention. Alternatively, as an example, when the second solution 30 is available that includes the quantum dots 16 to which the second ligands 26 are coordinated, the quantum dots 16 to which the first ligands 22 are coordinated can be obtained by synthesizing only the first ligands 22 and carrying out the replacement step. In other words, the ligands coordinated to the quantum dots synthesized by a known technique can be replaced by the first ligands 22, which simplifies the manufacturing process.

The method of manufacturing the light-emitting layer 8 in accordance with the present embodiment can separately synthesize the first ligands 22 and the quantum dots 16 and replace the ligands coordinated to the quantum dots 16, to synthesize the quantum dots 16 to which the first ligands 22 are coordinated. Therefore, such combinations of materials for the first ligands 22 and the quantum dots 16 that it becomes difficult to directly synthesize the quantum dots 16 to which the first ligands 22 are coordinated may be used in the present embodiment. This is however by no means intended to limit the scope of the invention. Alternatively, as an example, when it is possible to directly synthesize the quantum dots 16 to which the first ligands 22 are coordinated, the second ligands 26 do not need to be synthesized, and the replacement step may be skipped.

The light-emitting layer 8 in accordance with the present embodiment has a structure where the ligands 18 coordinated to the quantum dots 16 are polymerized. The polymerization of the ligands 18 in the process of forming the light-emitting layer 8 solidifies the light-emitting layer 8 in such a manner that the surface of the quantum dots 16 is covered by the polymerized ligands 18. Therefore, the quantum dots 16 do not aggregate when the light-emitting layer 8 is formed. The light-emitting layer 8 can be formed with the distances between the quantum dots 16 being controlled in a suitable manner. The polymerization can hence improve the stability of the quantum dots 16 in the light-emitting layer 8, thereby improving the lifetime of the light-emitting element 2.

The individual quantum dots 16 are surrounded by the polymerized ligands 18. This particular structure gives ample physical protection to the quantum dots 16 in the process of forming the light-emitting layer 8. The ligands 18 therefore remain stably coordinated to the quantum dots 16 after the light-emitting layer 8 is formed. In addition, the polymerized ligands 18 surrounding the quantum dots 16 can protect the quantum dots 16 from being degraded due to oxygen or water content. That in turn can further improve the stability of the quantum dots 16 in the light-emitting layer 8, which further improves the lifetime of the light-emitting element 2.

In related art, a binder may in some cases be added to a solution containing quantum dots to improve the dispersion of the quantum dots in the solution. The inclusion of a binder in the light-emitting layer might lead to increases in the resistance of the light-emitting elements. In the present embodiment, since the ligands 18 are polymerized to improve the stability of the quantum dots 16 in the light-emitting layer 8, the binder added to the first solution 24 can be reduced or is not needed at all. Since the ligands 18 include the modified functional groups 20 in the present embodiment, electrons can be as readily injected from the outside to the inside of the quantum dots 16 as from the outside to the inside of the quantum dots in related art. The present embodiment can hence restrain increases in the overall resistance of the elements while maintaining the efficiency of electron injection to the quantum dots.

In addition, in related art, when a binder is added to a solution containing quantum dots, a consideration needs to be given to compatibility between the binder and the ligands coordinated to the quantum dots. In contrast, in the present embodiment, the first ligands 22 including both the coordinating, modified functional groups and the polymerizable functional groups are coordinated to the quantum dots 16 before the polymerizable functional groups in the first ligands 22 are polymerized. There is hence no need to consider compatibility between the modified functional groups and the polymerizable functional groups, which allows for greater freedom in choosing materials for the ligands 18.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A light-emitting element comprising:

an anode;

a cathode; and a light-emitting layer between the anode and the cathode, wherein:

the light-emitting layer contains quantum dots and ligands, each of the ligands comprises a polymer including at least two repeating units, each of the at least two repeating units includes, at an end of at least one side chain thereof, a modified functional group coordinated with any one of the quantum dots, and each of the at least two repeating units has a formula (3):

[Chem. 3]

-continued

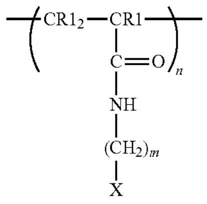

(3)

where n and m are natural numbers, X is the modified functional group, and each R1 is independently selected from a hydrogen atom, an alkyl group, an aryl group, and an alkoxy group.

2. The light-emitting element according to claim 1, wherein m is from 1 to 5, both inclusive.

3. The light-emitting element according to claim 1, wherein m is from 5 to 20, both inclusive.

4. The light-emitting element according to claim 1, wherein each ligand includes a polymerizable functional group.

5. The light-emitting element according to claim 1, wherein the modified functional group includes at least one of a thiol group, a hydroxyl group, a carboxy group, and an amino group.

6. The light-emitting element according to claim 1, further comprising:

a hole transport layer between the anode and the light-emitting layer; and an electron transport layer between the cathode and the light-emitting layer.

7. A light-emitting device comprising the light-emitting element according to claim 1.

8. A method of manufacturing the light-emitting element according to claim 1, the method comprising:

simultaneously heating, and shining ultraviolet light on, a first solution containing the quantum dots and first ligands, each first ligand including a polymerizable functional group including, at an end of at least one side chain of the polymerizable functional group, a first modified functional group coordinated to any one of the quantum dots, to form the light-emitting layer containing the quantum dots and the first ligands in which at least some of the polymerizable functional groups are polymerized with each other.

9. The method according to claim 8, wherein each first ligand includes 6-acrylamide hexanoic acid or 2-aminoethyl methacrylamide before simultaneously heating, and shining the ultraviolet light on, the first solution.

10. The method according to claim 8, wherein the first modified functional group includes at least one of a thiol group, a hydroxyl group, a carboxy group, and an amino group.

11. The method according to claim 8, further comprising, before simultaneously heating, and shining the ultraviolet light on, the first solution:

stirring the first solution and a second solution to replace second ligands, that coordinated to the quantum dots, with the first ligands, the second solution containing the quantum dots and the second ligands, each second ligand including no polymerizable functional group, but including a second modified functional group coordinated to at least one of the quantum dots.

12. The method according to claim 11, wherein the first solution contains an aqueous medium, and the second solution contains an organic medium.

13. The method according to claim 11, wherein the first solution contains a non-aqueous medium, and the second solution contains an aqueous medium.

* * * * *